(12) United States Patent
Chen et al.

(10) Patent No.: US 7,019,407 B2
(45) Date of Patent: Mar. 28, 2006

(54) FLIP CHIP PACKAGE STRUCTURE

(75) Inventors: Yu-Wen Chen, Kaohsiung (TW);
Ming-Lun Ho, Kaohsiung (TW);
Shih-Chang Lee, Kaohsiung (TW);
Chih-Huang Chang, Tainan Hsien (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/707,609

(22) Filed: Dec. 24, 2003

(65) Prior Publication Data
US 2004/0124540 A1 Jul. 1, 2004

(30) Foreign Application Priority Data
Dec. 30, 2002 (TW) ............................... 91137816 A (51) Int. Cl.
*H01L 23/48* (2006.01)

(52) U.S. Cl. ...................... 257/778; 257/737

(58) Field of Classification Search ............... 257/777, 257/778, 737, 738, 780, 717, 686, 724; 438/106, 438/108
See application file for complete search history.

(56) References Cited

U.S. PATENT DOCUMENTS

| | | | | |
|---|---|---|---|---|
| 5,352,926 A | * | 10/1994 | Andrews | 257/717 |
| 6,150,724 A | * | 11/2000 | Wenzel et al. | 257/777 |
| 6,586,844 B1 | * | 7/2003 | Chang | 257/779 |
| 6,768,190 B1 | * | 7/2004 | Yang et al. | 257/686 |
| 6,774,498 B1 | * | 8/2004 | Hsu et al. | 257/786 |
| 6,825,568 B1 | * | 11/2004 | Hung | 257/778 |

* cited by examiner

*Primary Examiner*—Hoai Pham
*Assistant Examiner*—(Vikki) Hoa B. Trinh
(74) *Attorney, Agent, or Firm*—Jiang Chyun IP Office (57) ABSTRACT

A flip chip package structure comprising a chip, a substrate, at least a first bump and a plurality of second bumps is provided. The chip has a first bump-positioning region and the substrate has a second bump-positioning region. The substrate has at least a first hole and multiple second holes. The first hole and the second holes are located within the second bump-positioning region. The first hole has a depth greater than that of the second hole. The first bump is set up between the first bump-positioning region of the chip and the second bump-positioning region of the substrate. The first bump is bonded to the substrate through the first holes. The second bumps are set up between the first bump-positioning region of the chip and the second bump-positioning region of the substrate. The second bumps are bonded to the substrate through the second holes. The first bump has a volume greater than the volume of the second bump.

8 Claims, 7 Drawing Sheets

FLIP CHIP PACKAGE STRUCTURE

CROSS REFERENCE TO RELATED APPLICATIONS

This application claims the priority benefit of Taiwan application serial no. 91137816, filed on Dec. 30, 2002.

BACKGROUND OF INVENTION

1. Field of Invention

The present invention relates to a flip chip package structure. More particularly, the present invention relates to a flip chip package structure having an improved reliability in the connection between the chip and the substrate inside the package.

2. Description of Related Art

The fabrication of integrated circuits (IC) in the semiconductor industry can be roughly divided into two major stages: an integrated circuit (IC) fabrication stage and an IC packaging stage. In general, a chip is an end product of a series of operations on a wafer including ion doping, circuit laying, dielectric-layer depositing and wafer dicing. After the production of a chip, a packaging operation is performed such that the chip is electrically connected to a substrate through conductive wires or bumps, for example. By packaging the chip, the chip as well as the electrical connection between the chip and the substrate is protected.

As the level of integration for the integrated circuits increases, a variety of packaging structures for the chip has been developed. Flip chip bonding is one of the techniques capable of reducing chip package area and shortening overall transmission paths. At present, flip chip bonding is widely adopted in the chip packaging arena to produce packages including the chip scale packages, direct chip attached (DCA) packages and the multi-chip module (MCM) packages.

In a conventional flip chip bonding process, a plurality of bumps are first attached to the bonding pads on a chip. Thereafter, a screen-printing method is used to deposit some solder material on the contacts of a substrate. The chip is then flipped over and the bumps on the chip are dipped into the solder material above various contacts. A reflow process is performed so that the solder material is able to combine with the bumps to form a plurality of bump blocks. Through the bump blocks, the chip not only is firmly attached to the substrate but is also electrically interconnected as well.

Some problems are often found in the aforementioned flip chip bonding process, for example: 1. Since the solder is a paste-like material, the bumps can hardly stand firmly over the contacts of the substrate after the bumps are attached on the solder positioned on the contacts of the substrate. If the substrate is subjected to a random external force, for example, by transportation or by some air current inside a reflow oven, the bumps may be shifted out of the desired contact position. 2. Since the difference in the coefficient of thermal expansion between the chip and the substrate is generally large, the substrate is likely to warp when subjected to heat. Ultimately, some of the bumps attached to the peripheral region of the chip may peel off from the substrate leading to a drop in the reliability of the electrical connection between the chip and the substrate. 3. The reference expansion point—where, in an ideal case, there is no stress due to thermal expansion between the chip and the substrate—does not always fall in the central region of the chip. If the reference expansion point is on one side of the chip, the bumps on the other side of the chip will be subjected to a larger stress and deformation. When the stress on this side of the chip exceeds a permitted range, the bumps will peel off from the substrate.

SUMMARY OF INVENTION

Accordingly, one object of the present invention is to provide a flip chip package structure capable of preventing a shift in the bump position due to a shake during transportation or a jolt due to an air current blowing inside a reflow oven before carrying out a reflow operation. Thus, the bumps are able to land on the desired locations.

A second object of this invention is to provide a flip chip package structure capable of preventing bumps from peeling off from a substrate and hence improving the reliability of electrical connection between the chip and the substrate.

To achieve these and other advantages and in accordance with the purpose of the invention, as embodied and broadly described herein, the invention provides a flip chip package structure. The flip chip package comprises a chip, a substrate, at least a first bump and a plurality of second bumps. The chip has a first bump-positioning region and the substrate has a second bump-positioning region. The substrate has at least a first hole and multiple second holes. The first hole and the second holes are located within the second bump-positioning region. The first hole has a depth greater than that of the second hole. The first bump is set up between the first bump-positioning region of the chip and the second bump-positioning region of the substrate. The first bump is bonded to the substrate through the first hole. The second bumps are set up between the first bump-positioning region of the chip and the second bump-positioning region of the substrate. The second bumps are bonded to the substrate through the second holes. The first bump has a volume greater than the volume of the second bump.

According to one embodiment of this invention, one first bump located in the middle of the first bump-positioning region. Furthermore, one first hole is located in the middle of the second bump-positioning region. Alternatively, two first bump are symmetrical relative to the shape center of the first bump-positioning region and positioned between the chip and the substrate. Furthermore, the number of first holes is also two and the second holes are symmetrical relative to the geographic center of the second bump-positioning region and positioned within the second bump-positioning region. Alternatively, the flip chip package has a plurality of first bumps. The first bumps are set up between the chip and the substrate and close to the corner area of the first bump-positioning region. The flip chip package also has a plurality of first holes. The first holes are positioned close to the corner area of the second bump-positioning region. In addition, each first bump set up between the chip and the substrate may or may not form an electrical interconnection.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1:
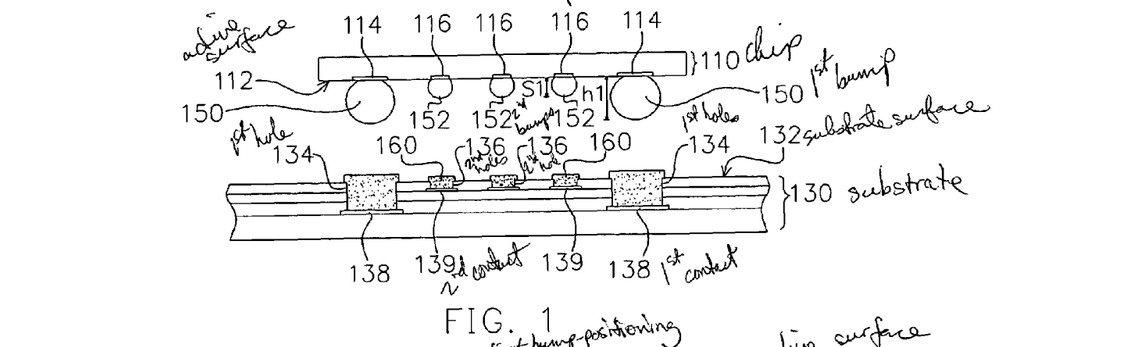
FIGS. 1 through 4 are magnified schematic cross-sectional views showing the progression of steps for fabricating a flip chip package according to a first preferred embodiment of this invention.
Figure 1A:
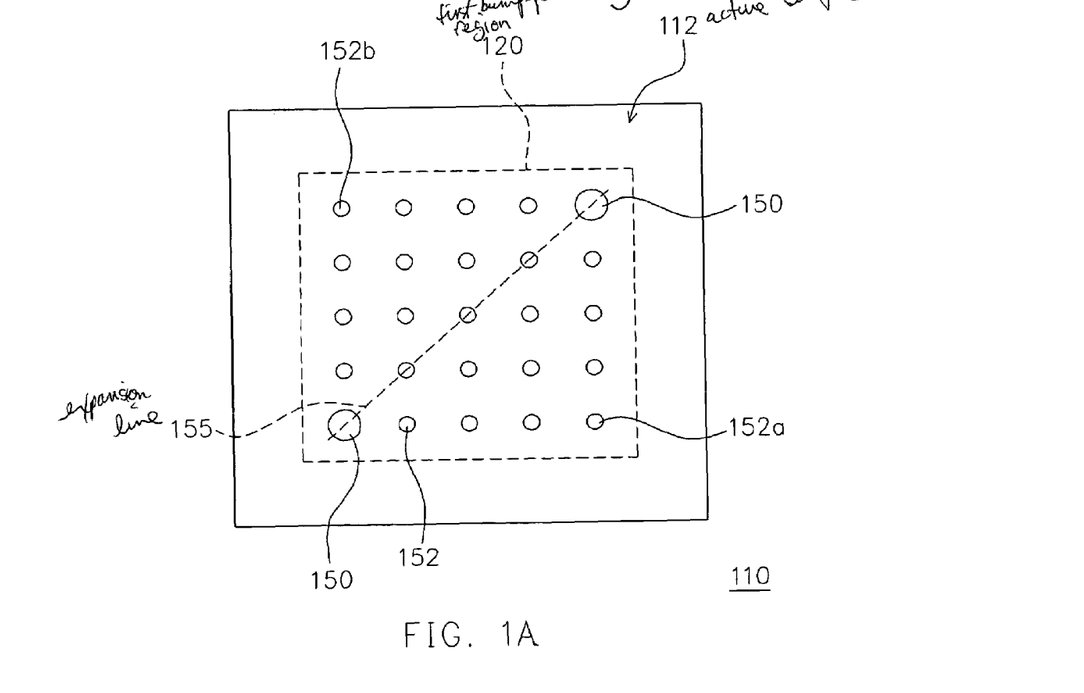
FIG. 1A is a plan view showing the positions of bumps on the chip as shown in FIG. 1.
Figure 1B:
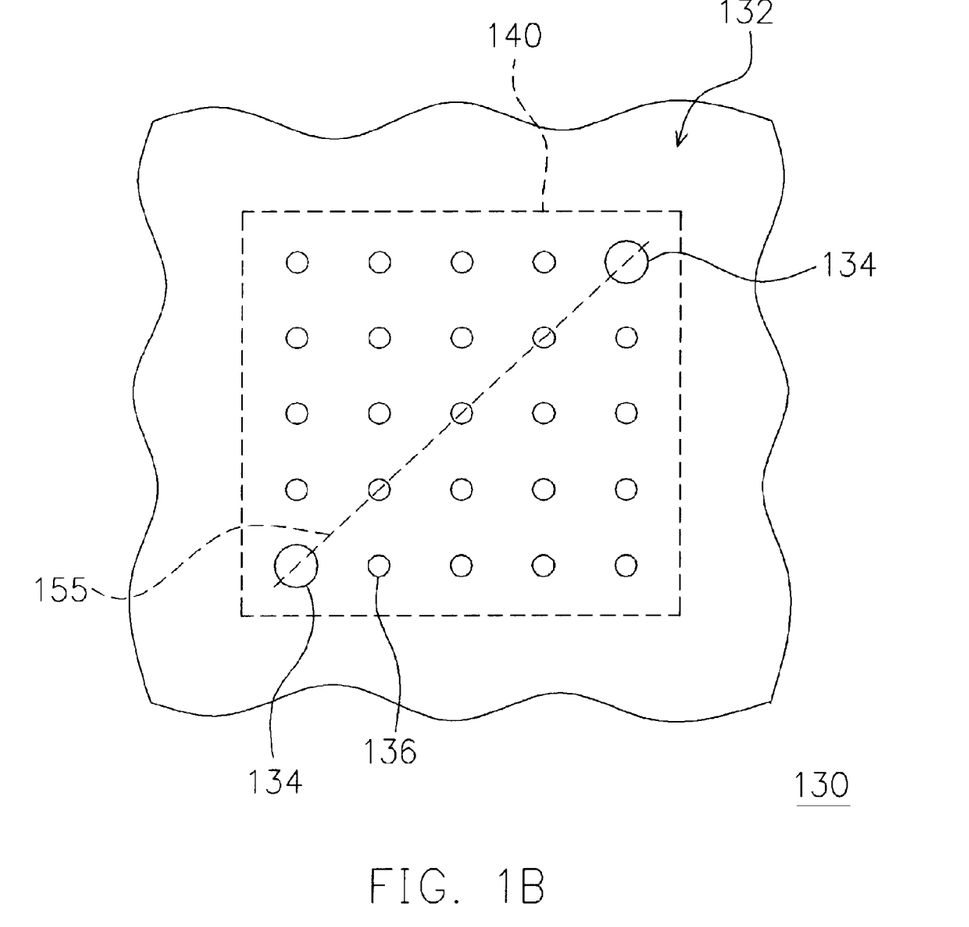
FIG. 1B is a plan view showing the positions of holes on the substrate as shown in FIG. 1.

FIGS. 1 through 4 are magnified schematic cross-sectional views showing the process steps for fabricating a flip chip package according to a first preferred embodiment of this invention. FIG. 1A is a plan view showing the positions of bumps on the chip as shown in FIG. 1. FIG. 1B is a plan view showing the positions of holes on the substrate as shown in FIG. 1. During fabricating a flip chip package, a chip 110 and a substrate 130 are first provided. The chip 110 has a first bump-positioning region 120 (a first bump-bonding region) located on an active surface 112 of the chip 110. The chip 110 also has two first bonding pads 114 and a plurality of second bonding pads 116 within the first bump-positioning region 120 of the active surface 112. The first bonding pads 114 are positioned on the first bump-positioning region 120 of the chip 110 and symmetrical to the centroid (geometric center) of the first bump-positioning region 120. The second bonding pads 116 are also positioned within the first bump-positioning region 120 of the chip 110.

The substrate 130 has a second bump-positioning region 140 (a second bump-bonding region) located on a substrate surface 132. The chip 110 is adapted to be positioned over the second bump-positioning region 140 of the substrate 130 and the first bump-positioning region 120 of the chip 110 corresponds in position to the second bump-positioning region 140 of the substrate 130. Furthermore, the substrate 130 has two first holes 134 and a plurality of second holes 136 on the substrate surface 132 within the second bump-positioning region 140. In addition, the substrate 130 has two first substrate contacts 138 and a plurality of second substrate contacts 139. The first holes 134 expose the first substrate contacts 138 while the second holes 136 expose the second substrate contacts 139. The first holes 134 have a depth greater than that of the second holes 136. The first holes 134 are positioned close to the corners of the substrate 130 and symmetrical relative to the centroid of the second bump-positioning region 140. The second holes 136 are positioned within the second bump-positioning region 140. Moreover, if the chip 110 is mounted to the substrate 130, the locations of the first bonding pads 114 of the chip 110 correspond to the locations of the first holes 134 and the first substrate contacts 138 in the substrate 130. Similarly, the second bonding pads 116 of the chip 110 correspond in position to the second holes 136 and the second substrate contacts 139 in the substrate 130.

Thereafter, two first bumps 150 are attached to the two first bonding pads 114 and a plurality of second bumps 152 are attached to the second bonding pads 116. The first bumps 150 have a configuration different from that of the second bumps 152. In this embodiment, both the first bumps 150 and the second bumps 152 has a spherical profile. Furthermore, the height h1 of the first bumps 150 is greater than the height s1 of the second bumps 152. For example, the height h1 of the first bumps 150 ranges from 150 micrometers to 200 micrometers and the volume of each first bump 150 is greater than the volume of any second bump 152. It should be noted that the each of the first bumps 150 has a cross-sectional area greater than the cross-sectional area of any of the first holes 134 in the substrate 130. In addition, a solder material is filled into the first holes 134 and the second holes 136 by a screen-printing process. The solder material 160 is a solder paste compound, for example.

Figure 2:
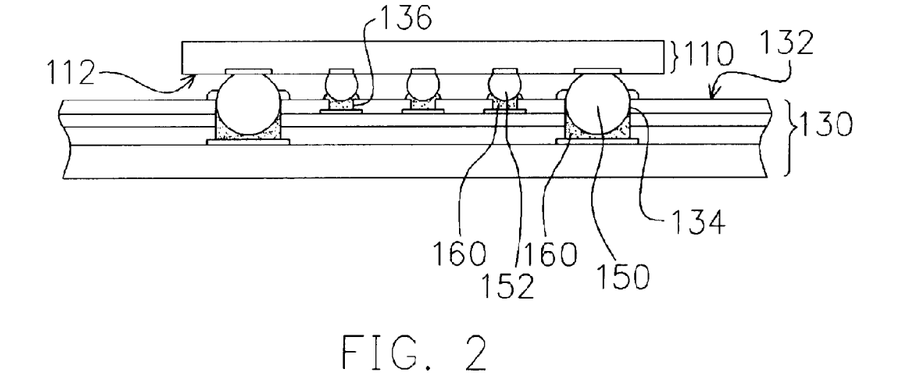

The chip 110 is then flipped over and the first bumps 150 are aligned with the first holes 134 on the substrate 130 and the second bumps 152 are aligned with the second holes 136 on the substrate 130. Thereafter, the chip 110 is mounted to the substrate 130 by fitting the first bumps 150 into the first holes 134 of the substrate 130 and adhering to the solder material 160 inside the first holes 134. Similarly, the second bumps 152 adhere to the solder material 160 inside the second holes 136. Because the first bumps 150 are designed to have a cross-sectional area slightly bigger than the cross-sectional area of the first holes 134 in the substrate 130, the first bumps 150 engage tightly with the corresponding first holes 134 through a tight-fit mechanism or a force-fit mechanism, once the chip 110 is placed on the substrate 130 as shown in FIG. 2. Hence, the chip 110 can be placed firmly on the desired position of the substrate 130 even if the substrate 130 is subjected to some jolting during transportation or subjected to an air current inside a reflow oven.

Figure 3:
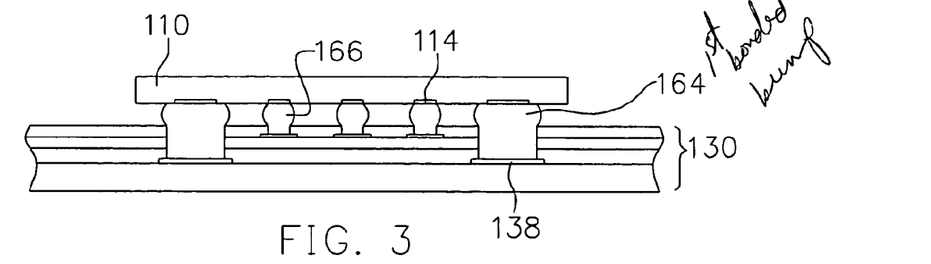

Thereafter, a reflow process is carried out so that the first bumps 150 bond with the solder material 160 inside the first holes 134 of the substrate 130 to form first bonded bumps 164. Similarly, the second bumps 152 bond with the solder material 160 inside the second holes 136 of the substrate 130 to form second bonded bumps 166, as shown in FIG. 3. The first bonded bumps 164 and the second bonded bumps 166 are located between the chip 110 and the substrate 130 for physically and electrically connecting the chip 110 and the substrate 130. In addition, the volume of each first bonded bump 164 is greater than that of any second bonded bump 166.

In this embodiment, the first bumps 150 are engaged to the corresponding first holes 134 in the substrate 130 through a tight-fit mechanism when the reflow process is performed. Hence, the chip 110 and the substrate 130 will expand toward the two sides of a reference expansion line 155 linking the two first bumps 150 (as shown in FIGS. 1A and 1B). Since the reference expansion line 155 symmetrically partitions the first bump-positioning region 120 and the second bump-positioning region 140 into equal halves, the distances between the two bumps 152a, 152b that are farthest from the reference expansion line 155 and the reference expansion line 155 are equal. Thus, when the chip 110 and the substrate 130 experience a thermal cycle, the second bumps 152a and 152b have a similar degree of deformation and the thermal-expansion stress endured by the second bumps 152a and 152b is even. In other words, the probability of the second bumps 152a and 152b peeling off from the substrate 130 is lowered and reliability of the connection between the chip 110 and the substrate 130 is improved.

Even in the presence of warpage of the substrate 130 or the effect of stress due to different coefficients of thermal expansion between the chip 110 and the substrate 130, the first bumps 150 set in the corner of the first bump-positioning region 120, due to having a larger volume and a greater height, can solve the problem caused by these negative effects resulting in a relatively large distance existing between the chip bonding pads 114 and the substrate contacts 138.

Figure 4:
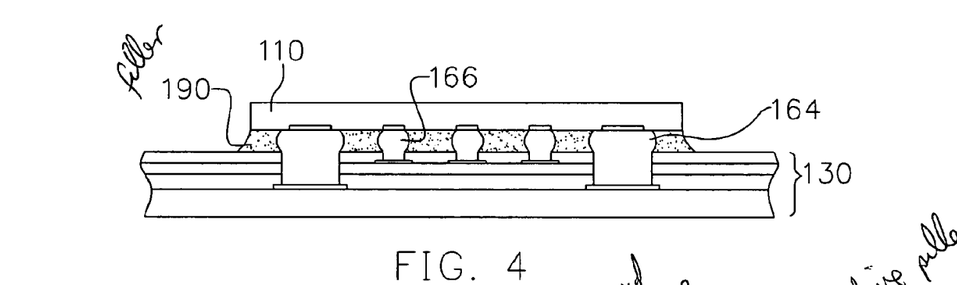

Finally, a filler 190 is filled into the space between the chip 110 and the substrate 130 and the filler 190 encloses the first bonded bumps 164 and the second bonded bumps 166, as shown in FIG. 4.

Figure 5:
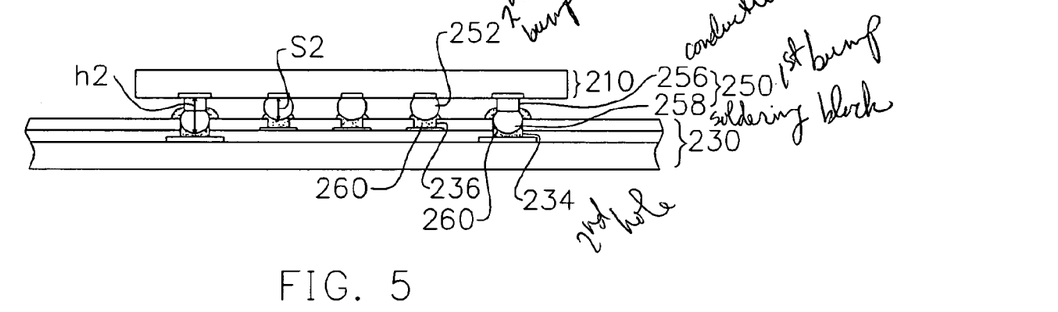
FIG. 5 is a magnified schematic cross-sectional view of a flip chip package according to a second preferred embodiment of this invention.

In the aforementioned embodiment, the first bumps have a spherical shape. However, the present invention is not limited to the above description. FIG. 5 is a magnified schematic cross-sectional view of a flip chip package according to a second preferred embodiment of this invention. In FIG. 5, each first bump 250 consists of a conductive pillar 256 and a soldering block 258. Each first bump 250 has a volume and a height h2 greater than the volume and the height s2 of each second bump 252. The height h2 of the first bumps 250 ranges from 150 μm to 200 μm, for example. Each first hole 234 has a depth greater than that of each second hole 236. After positioning the chip 210 over the substrate 230, the soldering blocks 258 of the first bumps 250 join up with the first holes 234 in the substrate 230 and adhere to the solder material 260 inside the first holes 234. The second bumps 252 have a spherical profile and are attached to the solder material 260 within the second holes 236 of the substrate 230. Since the soldering blocks 258 have a cross-sectional area greater than that of the first holes 234 in the substrate 230, the soldering blocks 258 can tightly fit into the first holes 234 in the substrate 230 through a thigh-fit mechanism after mounting the chip 210 onto the substrate 230.

Figure 6:
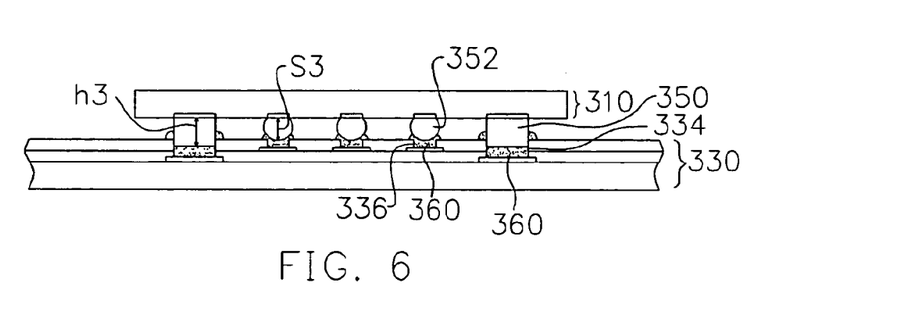
FIG. 6 is a magnified schematic cross-sectional view of a flip chip package according to a third preferred embodiment of this invention.

FIG. 6 is a magnified schematic cross-sectional view of a flip chip package according to a third preferred embodiment of this invention. As shown in FIG. 6, the first bumps 350 are in pillar shapes and each has a volume and a height h3 greater than the volume and the height s3 of each second bump 352. The height h3 of the first bumps 350 ranges from 150 μm to 200 μm, for example. The first holes 334 have a depth greater than that of the second holes 336. After mounting the chip 310 onto the substrate 330, the first bumps 350 join up with the first holes 334 in the substrate 330 and adhere to the solder material 360 inside the first holes 334. The second bumps 352 have a spherical profile and are attached to the solder material 360 within the second holes 336 of the substrate 330. Since the first bumps 350 have a cross-sectional area greater than that of the first holes 334 in the substrate 330, the first bumps 350 can tightly fit into the first holes 334 in the substrate 330 through a thigh-fit mechanism after placing the chip 310 onto the substrate 330.

In the aforementioned embodiment, the first bumps and the first bonded bumps electrically connect with the substrate. However, the first bumps and the first bonded bumps may simply be used as a physical connection between the chip and the substrate, without providing any electrical functions.

Figure 7A:
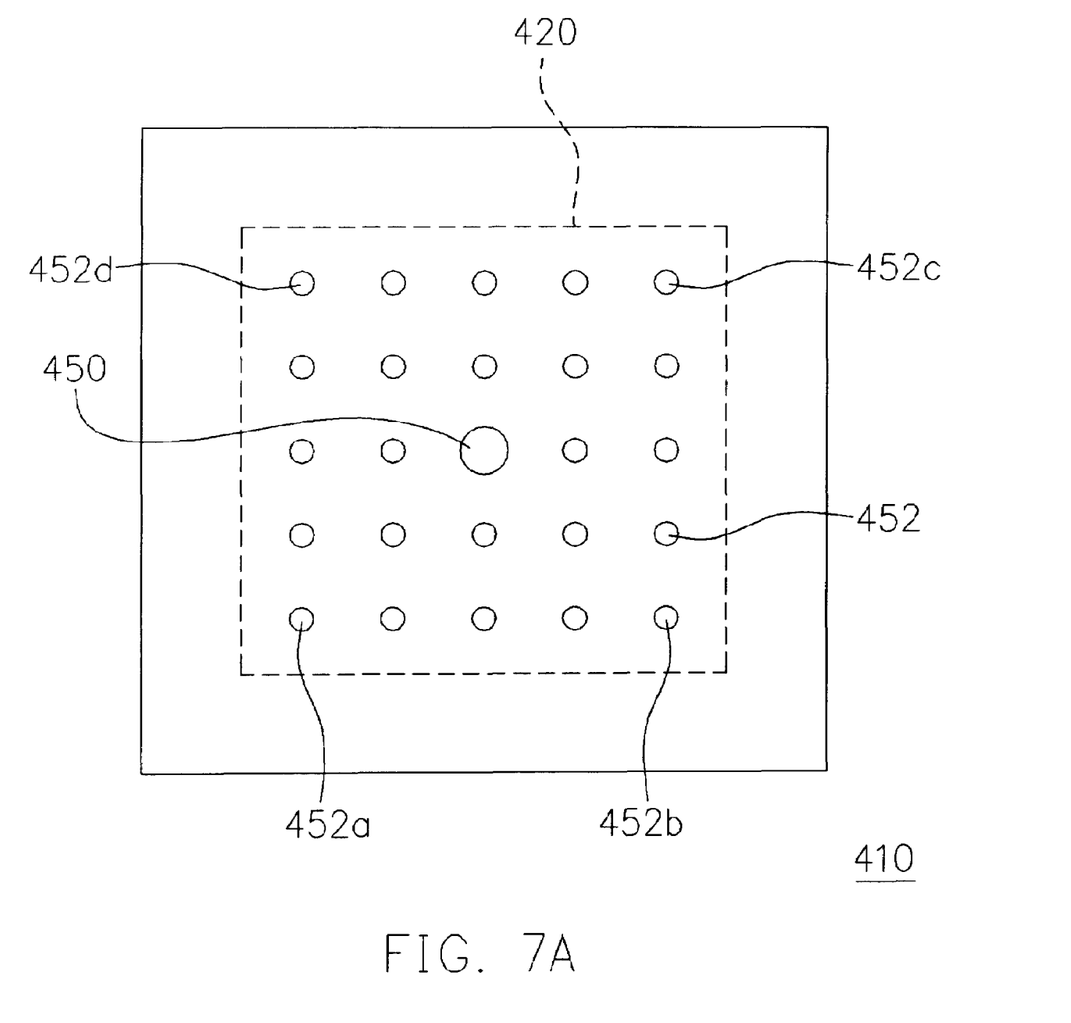
FIG. 7A is a plan view showing the position of bumps on a chip according to a fourth preferred embodiment of this invention.
Figure 7B:
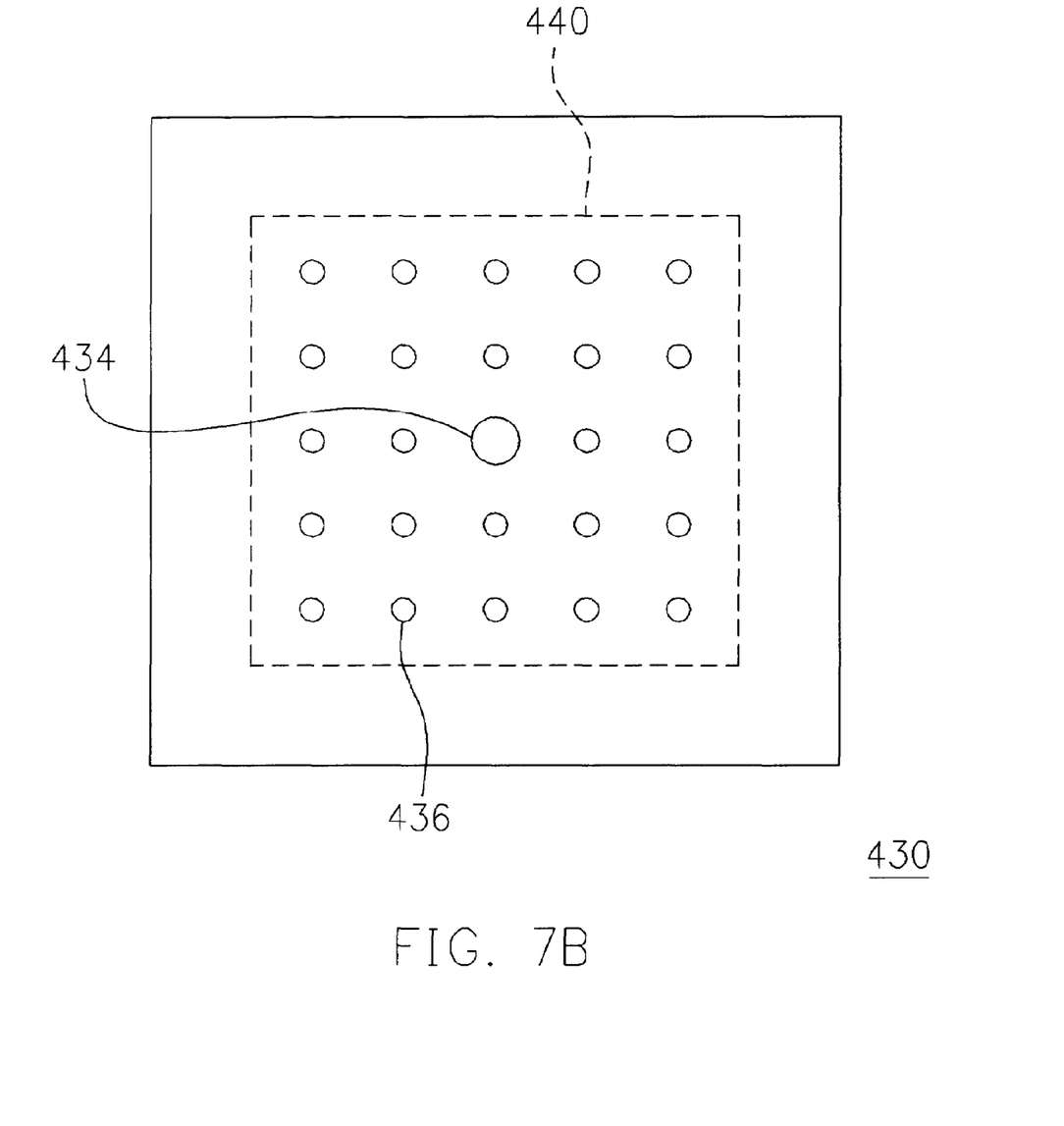
FIG. 7B is a plan view showing the position of holes on a substrate according a fourth preferred embodiment of this invention.

In addition, the first bumps are arranged close to the corners of the first bump-positioning region of the chip and the first holes are arranged close to the corners of the second bump-positioning region of the substrate. However, the present invention is not limited to the above description. Alternatively, for example, a first bump 450 is positioned in the middle of the first bump-positioning region 420 of the chip 410 and a first hole 434 is positioned in the middle of the second bump-positioning region 440 of the substrate 430 as shown in FIGS. 7A and 7B. FIG. 7A is a plan view showing the position of bumps on a chip according to a fourth preferred embodiment of this invention. FIG. 7B is a plan view showing the position of holes on a substrate according the fourth preferred embodiment of this invention. The first bump 450 has a volume and a height greater than those of the second bumps 452. The first hole 434 has a depth greater than that of the second holes 436. The first bump 450 may have a spherical shape similar to the one in the first embodiment or may consist of a conductive pillar and a soldering block similar to the one in the second embodiment or may have a pillar shape similar to the one in the third embodiment. In this embodiment, the first bump 450 is tightly fitted to the first hole 434 in the substrate 430 through a tight-fit mechanism after the chip 410 is placed on the substrate 430. Hence, during a reflow process, the chip 410 and the substrate 430 can expand outward relative to the first bump 450 that serves as a reference expansion point. Because the first bump 450 (the reference expansion point) is located in the middle of the first bump-positioning region 410 of the chip 410, the distances between the second bumps 452a, 452b, 452c, 452d and the first bump 450 (the reference expansion point) are equal. Therefore, the degree of deformation in the second bumps 452a, 452b, 452c, 452d caused by thermal expansion is roughly equal and the thermal expansion stress is distributed evenly between the second bumps 452a, 452b, 452c, 452d. This prevents any one of the second bumps 452a, 452b, 452c, 452d from peeling away from the substrate 430 and improves the connection between the chip 410 and the substrate 430.

Figure 8A:
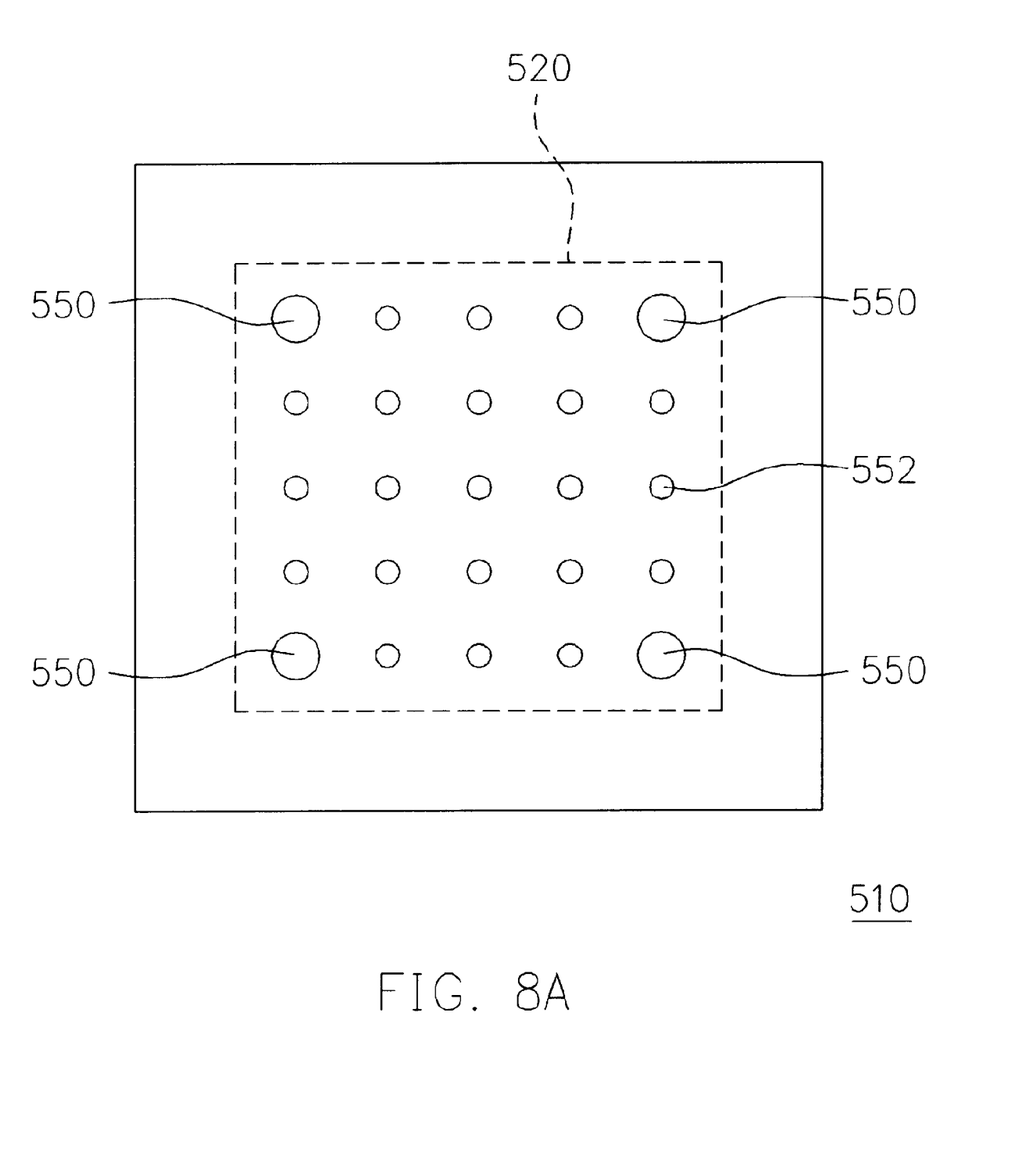
FIG. 8A is a plan view showing the position of bumps on a chip according to a fifth preferred embodiment of this invention.
Figure 8B:
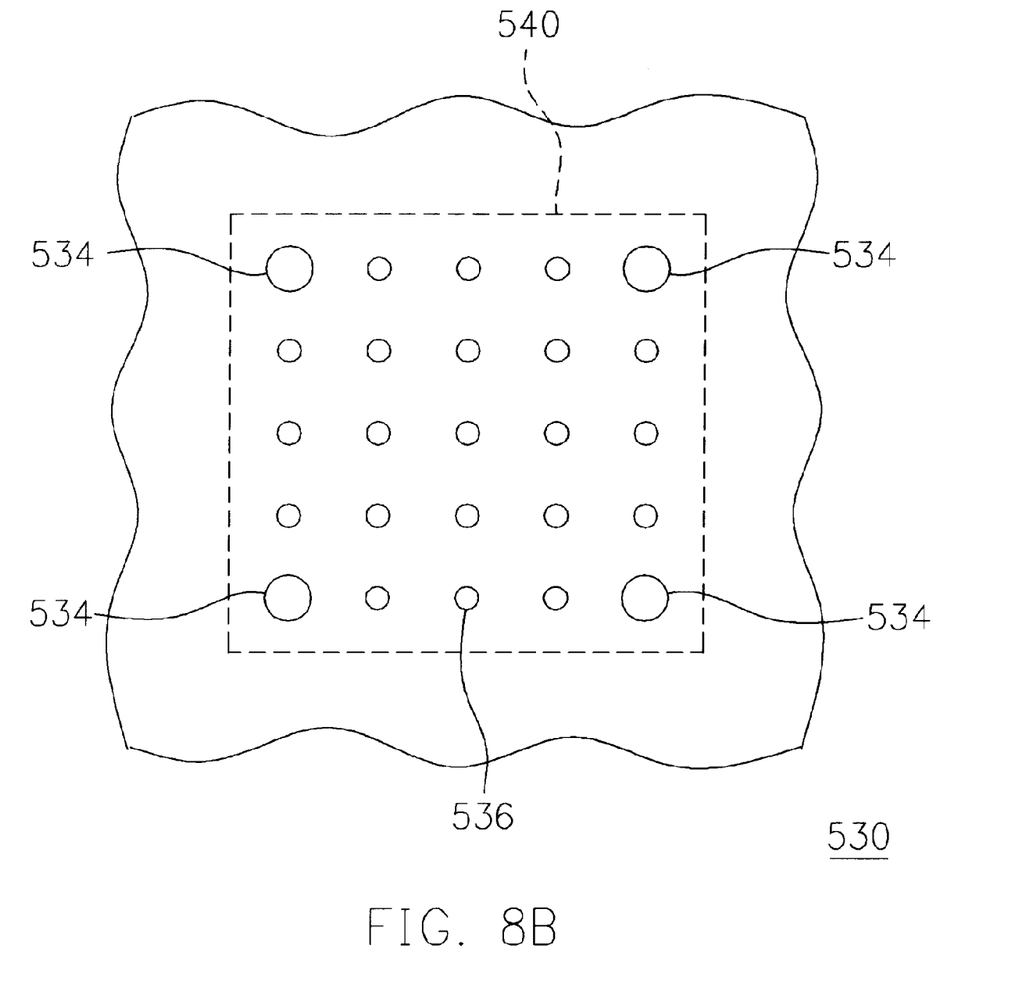
FIG. 8B is a plan view showing the position of holes on a substrate according a fifth preferred embodiment of this invention.

This invention also permits positioning first bumps 550 at all corners of a chip 510 within a first bump-positioning region 520 and first holes 534 at all corners of a substrate 530 within a second bump-positioning region 540 as shown in FIGS. 8A and 8B. FIG. 8A is a plan view showing the position of bumps on a chip according to a fifth preferred embodiment of this invention. FIG. 8B is a plan view showing the position of holes on a substrate according the fifth preferred embodiment of this invention. The first bumps 550 have a volume and a height greater than those of the second bumps 552. The first holes 534 have a depth greater than that of the second holes 536. The first bumps 550 may have a spherical shape similar to the one in the first embodiment or may consist of a conductive pillar and a soldering block similar to the one in the second embodiment or may have a pillar shape similar to the one in the third embodiment. After placing the chip 510 onto the substrate 530, the first bumps 550 are tightly fitted to the first holes 534 in the substrate 530 through a tight-fit mechanism.

In all the aforementioned embodiments, the tight-fit bump-and-hole connection structure is applied to a package structure including a chip and a substrate carrier. However, the tight-fit bump-and-hole structure can also be used to join up any two carriers such as two chips or two substrates as well.

In summary, advantages of this invention at least includes: 1. The flip chip package utilizes larger and higher first bumps attached to the chip to engage tightly with corresponding first holes in the substrate through a tight-fit mechanism. Thus, the first bumps as well as the second bumps can be firmly positioned to the expected locations of the substrate despite some impact caused by transport or the presence of air draft inside a reflow oven. 2. This invention can set up the reference expansion point or reference expansion line between the chip and the substrate through the arrangement of tight-fit bump-and-hole connection structure(s). The reference expansion point can be arranged in the middle of a bump-positioning region or the reference expansion line can partition the bump-positioning region into equal areas. Thus, the shift in distance between the bonding pad on the chip furthest from the reference expansion point or line and the corresponding substrate contact is minimized. In other words, the stress on the second bumps furthest from the reference expansion point or line is reduced and hence the reliability of connection between the chip and the substrate is improved. 3. By positioning first bumps having a larger volume and height at locations in the corner of the first bump-positioning region, the problem caused by the warpage of the substrate and the difference in thermal expansion between the chip and the substrate can be alleviated. Therefore, the probability of the first and second bumps close to the peripheral region peeling away from the substrate is greatly reduced. Hence, reliability of the connection between the chip and the substrate is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip package structure, comprising:
   a chip having a first bump-positioning region;
   a substrate having a second bump-positioning region, at least a first hole and a plurality of second holes, wherein the first hole and the second holes are located within the second bump-positioning region, and the first hole has a depth greater than the second holes;
   at least a first bump arranged between the first bump-positioning region of the chip and the second bump-positioning region of the substrate, wherein the first bump and the substrate are bonded together via the first hole;
   a plurality of second bumps arranged between the first bump-positioning region of the chip and the second bump-positioning region of the substrate, wherein the second bumps and the substrate are bonded together via the second holes; and
   a filler material disposed between the chip and the substrate and encapsulating the first bumps and the second bumps;
   wherein the first bump has a volume larger than a volume of the second bump.

2. The flip chip package structure of claim 1, wherein when there is one first bump and one first hole, the first bump is located in the middle of the first bump-positioning region of the chip and the first hole is located in the middle of the second bump-positioning region.

3. The flip chip package structure of claim 1, wherein when there are two first bumps and two first holes, the two first bumps are positioned between the chip and the substrate and symmetrical relative to a centroid of the first bump-positioning region, and the two first holes are positioned in the second bump-positioning region and symmetrical relative to a centroid of the second bump-positioning region.

4. The flip chip package structure of claim 1, wherein the package structure has a plurality of first bumps and the first bumps are located close to corners of the first bump-positioning region and located between the chip and the substrate, and the substrate has a plurality of first holes and the first holes are positioned close to corners of the second bump-positioning region.

5. The flip chip package structure of claim 1, wherein the first bump arranged between the chip and the substrate physically but not electrically connects the chip and the substrate.

6. The flip chip package structure of claim 1, wherein the first bump arranged between the chip and the substrate electrically and physically connects the chip and the substrate.

7. The flip chip package structure of claim 1, wherein the first bump further comprises:
   a conductive pillar arranged on the chip; and
   a soldering block arranged on the conductive pillar.

8. The flip chip package structure of claim 1, wherein the first bump has a height ranging from about 150 µm to about 200 µm.

* * * * *